United States Patent
Iwasaki

[11] Patent Number: 6,103,574
[45] Date of Patent: Aug. 15, 2000

[54] METHOD OF MANUFACTURING NON-VOLATILE SEMICONDUCTOR MEMORY DEVICE HAVING REDUCED ELECTRICAL RESISTANCE OF A SOURCE DIFFUSION LAYER

[75] Inventor: Shota Iwasaki, Tokyo, Japan

[73] Assignee: NEC Corporation, Tokyo, Japan

[21] Appl. No.: 09/357,958

[22] Filed: Jul. 21, 1999

[30] Foreign Application Priority Data

Jul. 21, 1998 [JP] Japan .................................. 10-205291

[51] Int. Cl.⁷ .......................... H01L 21/336; H01L 21/76; H01L 21/36; H01L 27/10
[52] U.S. Cl. .......................... 438/257; 438/262; 438/294; 438/295; 438/296; 438/424; 438/430; 438/279; 257/506
[58] Field of Search .................................... 438/218, 219, 438/221, 257, 197, 262, 294, 295, 296, 589, 424, 430, 444, 445, 446, 447, 268, 279; 257/506, 510, 513, 514, 515, 314, 315

[56] References Cited

U.S. PATENT DOCUMENTS

| | | | |
|---|---|---|---|
| 4,824,795 | 4/1989 | Blanchard | 437/62 |
| 5,100,814 | 3/1992 | Yamaguchi et al. | 437/31 |
| 5,923,063 | 7/1999 | Liu et al. | 257/316 |
| 5,989,959 | 11/1999 | Araki | 438/258 |
| 5,998,267 | 12/1999 | Bergemont et al. | 438/270 |
| 6,034,393 | 3/2000 | Sakamoto et al. | 257/315 |
| 6,037,247 | 3/2000 | Anand | 438/618 |

FOREIGN PATENT DOCUMENTS

| | | |
|---|---|---|
| 4-62874 | 2/1992 | Japan . |
| 8-37285 | 2/1996 | Japan . |

*Primary Examiner*—Matthew Smith
*Assistant Examiner*—Lex H. Malsawma
*Attorney, Agent, or Firm*—McGinn & Gibb, P.C.

[57] ABSTRACT

In a non-volatile semiconductor memory device making electrical writing and erasing possible, source diffusion layers arranged on a substrate and along at least control gate electrodes have, in one part thereof, inclined portions having an angle larger than an ion implantation angle. According to this, device isolation technique is used to lower the resistance of the source diffusion layer.

6 Claims, 18 Drawing Sheets

METHOD OF MANUFACTURING NON-VOLATILE SEMICONDUCTOR MEMORY DEVICE HAVING REDUCED ELECTRICAL RESISTANCE OF A SOURCE DIFFUSION LAYER

BACKGROUND OF THE INVENTION

1. Field of the Invention

The present invention relates to a non-volatile semiconductor memory device and a process for producing the same, and in particular to a non-volatile semiconductor memory device making it possible to reduce the electrical resistance of a source diffusion layer, and a process for producing the same.

2. Related Art

Recently, with advances in the compactness, device-speed and integration degree of a semiconductor device, techniques for reducing the region of its chip and improving the density of its wiring have been becoming important.

Concerning a non-volatile semiconductor memory device, however, it is pointed out that the reduction in the area of the chip and the increase in the wiring density result in a problem that the resistance in its wiring portion, in particular its source diffusion layer becomes high.

In other words, a device isolation structure in a semiconductor device is usually formed by oxidizing its silicon substrate selectively according to well-known LOCOS (Local Oxidation of Silicon).

In this manner, however, a portion called bird's beak is generated at the edge of the resultant oxide film in the case wherein the cell structure of the device is made minute. This bird's beak is a structure disadvantageous for making the element minute in the transverse direction of the elements.

When the element is made minute in the transverse direction, a method called trench device isolation is effective. However, a non-volatile semiconductor memory device having a usual trench device isolation has a problem that the resistance of its source diffusion layer becomes high when self-aligned source etching based on anisotropic dry etching is used.

The following will describe a non-volatile semiconductor memory device having a conventional trench device isolation structure. FIG. 1 is a plan view illustrating a non-volatile semiconductor memory device having a common trench device isolation structure, as will also be described later. FIGS. 18A, 18B and 18C are cross sections of a non-volatile semiconductor memory device having a conventional trench device isolation structure, and are cross sections taken on I—I line, II—II line, and III—III line of FIG. 1, respectively.

It is noted that a non-volatile semiconductor memory device having a trench device isolation structure is not prior art. FIGS. 18A to 18C show cross sections of a device if a conventional trench device isolation technique is applied to the non-volatile semiconductor memory device.

As illustrated in FIGS. 18A to 18C, in the conventional trench device isolation structure, the surface of a substrate 1 is stepwise and source diffusion layer 8b are formed on respective surfaces, having different levels, of the substrate 1. Thus, dopant ions constituting the source diffusion layer 8b are not implanted into the side walls of the steps. For this reason, the source diffusion layer 8b becomes an unstable and discontinuous structure, so that their resistance is high. In FIGS. 18A to 18C, numeral 2 denotes a trench device isolation layer, numeral 3 denotes a floating gate, numeral 5 denotes a control gate electrode, numerals 4 and 6 denote a gate insulating film, numeral 8a denotes a drain diffusion layer, numeral 9 denotes an aluminum wiring, numeral 10 denotes a contact hole, numeral 11 denotes an interlayer insulating film, and numeral 12 denotes a side-wall oxide film.

Hitherto, therefore, it has been greatly demanded that the following is developed: a non-volatile semiconductor memory device having a cell structure which can make the resistance of the source diffusion layer 8b low.

As described above, however, in the case of using a trench device diffusion manner suitable for making the memory device minute, the resistance of the source isolation layers 8b is made high for the above-mentioned reason.

If, for example, oblique ion implantation is performed as ion implantation for overcoming the above-mentioned problem, ions can be continuously implanted even into the diffusion layers having different levels.

At this time, however, the ions are implanted in the channel of a transistor, as well. Thus, according to this method, a structure unsuitable for making the memory device minute is made.

Japanese Patent Application Laid-Open No. 8-37285 states that the non-volatile semiconductor memory device disclosed therein makes it possible to generate stable applying-voltage by using self alignment and transversal diffusion. However, this publication does not describe any technique for reducing the resistance of a source diffusion layer.

Japanese Patent Application Laid-Open No. 4-62874 discloses a semiconductor device wherein the surface of a gate electrode and the surface of a device isolation layer are made flat to prevent alignment gap and stabilize on-resistance and withstand voltage of a high-voltage withstanding transistor. However, this publication does not describe any technique for reducing the resistance of a source diffusion layer.

SUMMARY OF THE INVENTION

It is an object of the present invention to provide a non-volatile semiconductor memory device which makes it possible that the resistance of source diffusion layer is lowered even when device isolation technique suitable for making the elements minute is used, and a process for producing the same.

In order to attain the above-mentioned object, there is provided an electrical writable and erasable non-volatile semiconductor memory device by the present invention. The non-volatile semiconductor memory device comprises: a substrate; a control gate electrode on the substrate and a source diffusion layer arranged at a surface of the substrate and along at least the control gate electrode. The source diffusion layer has, in at least one part thereof, an inclined portion in a thickness direction, which has an angle larger than an ion implantation angle with respect to the thickness direction of the substrate.

The process of the present invention is a process for producing an electrical writable and erasable non-volatile semiconductor memory device. The process comprises the steps of:

forming a trench whose side wall is formed to have an angle with respect to the thickness direction of the substrate, said angle being larger than an ion implantation angle, at a surface of a substrate, along a predetermined direction on the surface of the substrate and in parallel to each other, depositing oxide film in the trench to form trench device isolation layer, forming a first gate insulating layer and a first conductive layer in sequence on the surface of the substrate and then patterning them, to form floating gate electrodes on at least one part of the surface of the substrate which is not covered with the trench device isolation layer, depositing and forming a second gate insulating layer and a second conductive layer in sequence on the surface of the floating gate electrode and the trench device isolation layer and then patterning them, to form, along a direction perpendicular to the trench device isolation layer, control gate electrode with which the surface of the trench device isolation layer and the floating gate electrode are alternately covered, implanting and diffusing a dopant into the surface of the substrate exposed along at least one side wall of each of the control gate electrode, to form a drain region, forming side wall oxide film on the side wall of electrode portion wherein the control gate electrode and the floating gate electrode are stacked, and removing the floating gate electrode other than the floating gate electrode covered with the control gate electrode, covering the drain region formed along one side wall of the control gate electrode with a resist and performing etching with the use of the resist and the control gate electrode as masks, to remove the trench device isolation layer arranged on the surface of the substrate exposed along the other side wall of the control gate electrode, implanting and diffusing a dopant into the surface of the substrate exposed along the other side wall of the control gate electrode in an uneven form, after removal of the trench device isolation layer, in the state that the resist remains, at an ion implantation angle smaller than the inclination angle of the side wall of the trench device isolation layer, to form source diffusion layer, and forming an interlayer insulation layer on the entire surface of the substrate, forming contact holes in at least one part of the drain diffusion layer, and then connecting wiring layer having a given pattern to the contact holes.

Since the non-volatile semiconductor memory device according to the present invention and the process for producing the same are technical features as described above, even the source diffusion layer in an uneven form can be made stable and low in resistance by self-aligned source etching of the non-volatile semiconductor memory device using the device isolation layer including trench device isolation structure. In order to lower the layer-resistance of the source diffusion layer in an uneven form, having trench device isolations, the side walls of these trench device isolations are formed to have an angle not smaller than an ion implantation angle. In this way, the device isolations are formed.

Another non-volatile semiconductor memory device according to the present invention has a device isolation layer including trench device isolation structure. Furthermore, when its source diffusion layer is formed by self-aligned source etching, silicon constituting the substrate and the oxide film constituting the device isolation layer are etched by means of an etching gas having the same etching rate for the two. Thus, the source diffusion layer can be made to be the structure of the same plane which does not have any level difference. Moreover, when the source diffusion layer is subjected to self-aligned source etching, isotropic dry etching is used. Thus, at least the side wall of the P-type silicon substrate between the floating gate and the base face of the source diffusion layer is made to have an angle not smaller than the ion implantation angle.

According to the non-volatile semiconductor memory device according to the present invention and the process for producing the same, the side wall of the trench device isolation layer suitable for making the device elements minute is beforehand formed to have an inclination angle not smaller than the ion implantation angle, so as to lower the resistance of the source diffusion layer 8b having an uneven form based on self-aligned source etching without any increase in the number of photolithography operations.

DESCRIPTION OF PREFERRED EMBODIMENTS

Referring to the attached drawings, the non-volatile semiconductor memory device according to the present invention and a process for producing the same will be described in detail, hereinafter.

Figure 1:
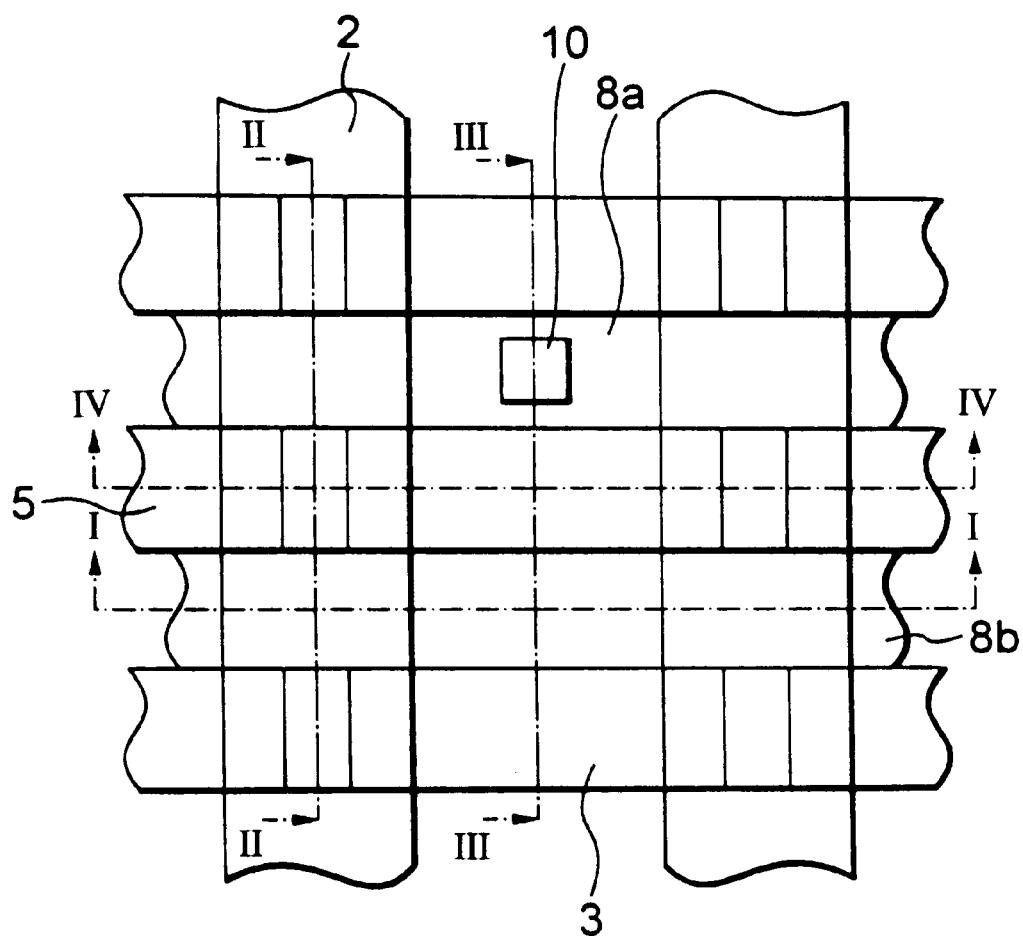
FIG. 1 is a plan view illustrating a non-volatile semiconductor memory device according to an embodiment of the present invention.
Figure 2A:
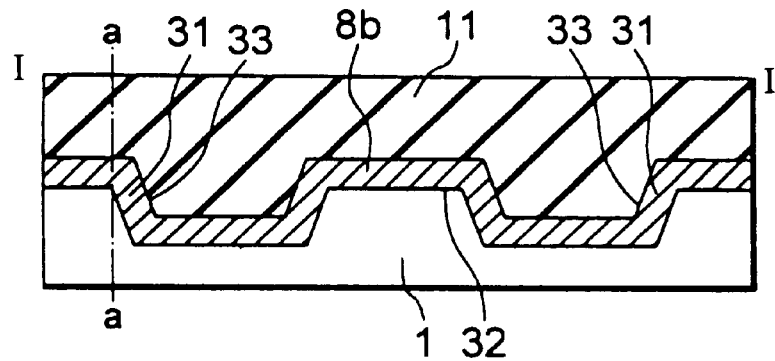
FIGS. 2A to 2C are cross sections of a non-volatile semiconductor memory device according to a first embodiment of the present invention, and are cross sections taken on I—I line, II—II line, and III—III line of FIG. 1, respectively.
Figure 2B:
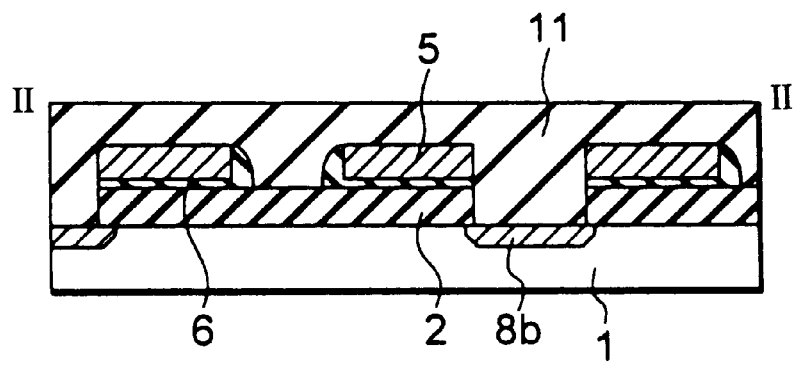
Figure 2C:
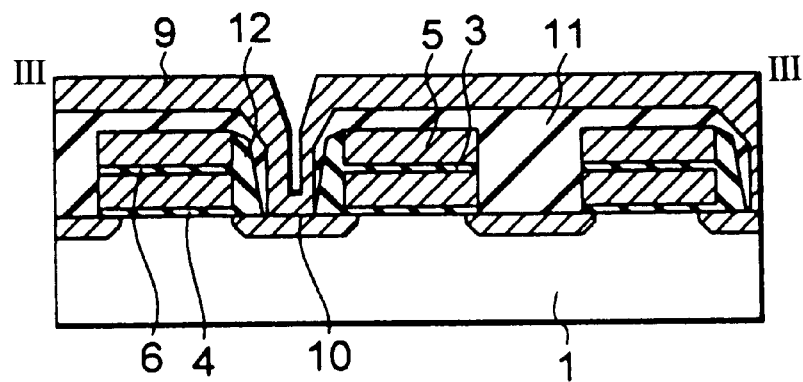
Figure 3A:
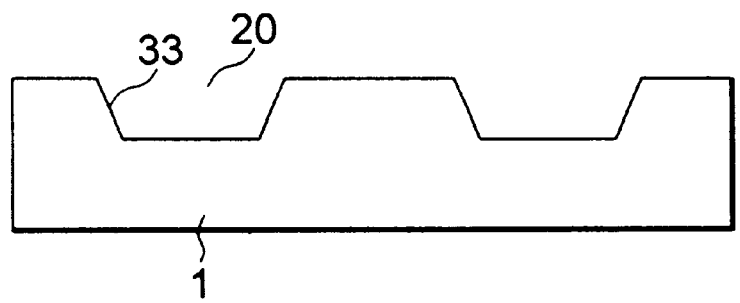
FIGS. 3A to 3D illustrate a process for producing the non-volatile semiconductor memory device according to the first embodiment of the present invention, and are cross sections taken on I—I line, II—II line, III—III line and IV—IV line of FIG. 1, respectively.
Figure 3B:
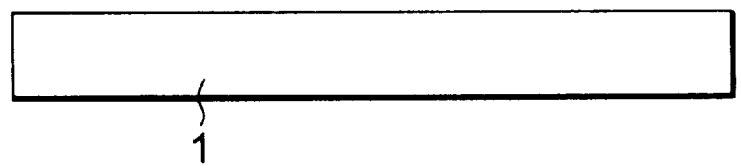
Figure 3C:
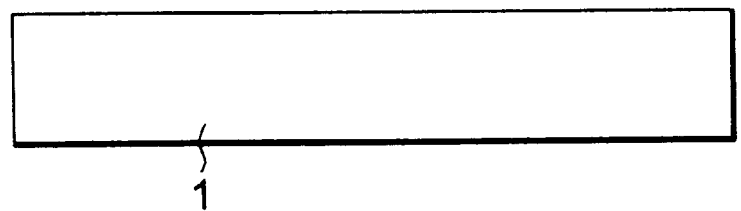
Figure 3D:
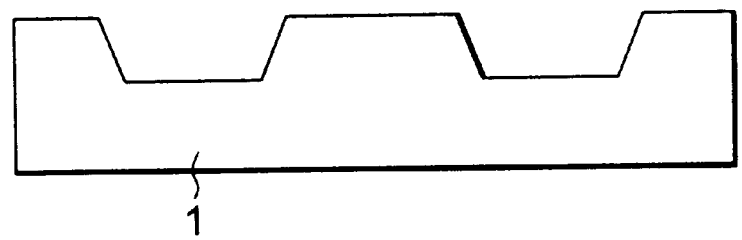
Figure 4A:
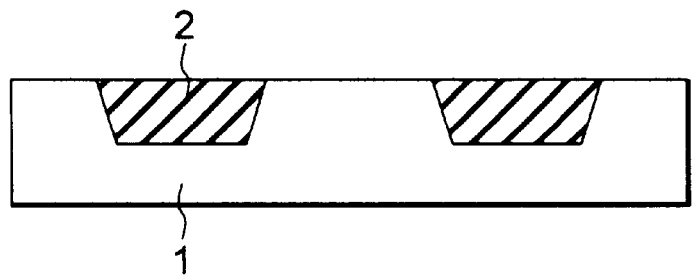
FIGS. 4A to 4D are cross sections illustrating the steps next to the steps illustrated in FIGS. 3A to 3D.
Figure 4B:
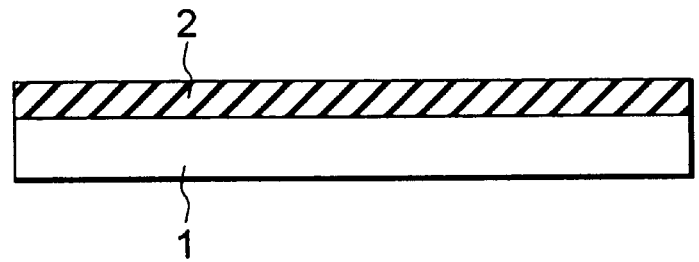
Figure 4C:
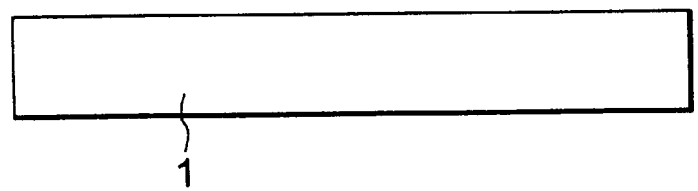
Figure 4D:
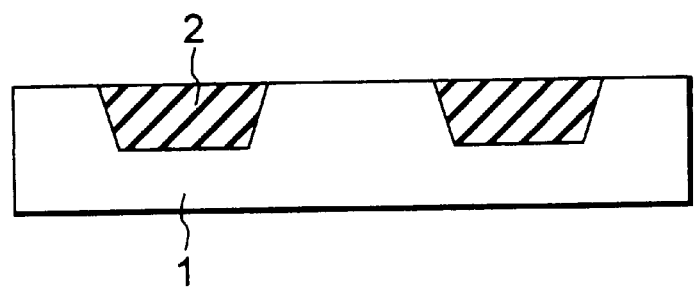
Figure 5A:
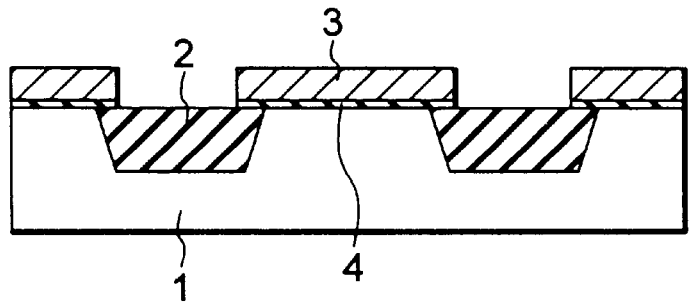
FIGS. 5A to 5D are cross sections illustrating the steps next to the steps illustrated in FIGS. 4A to 4D.
Figure 5B:
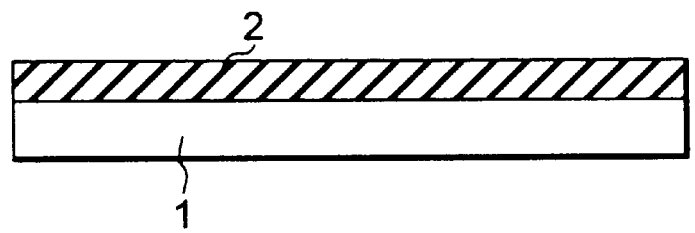
Figure 5C:
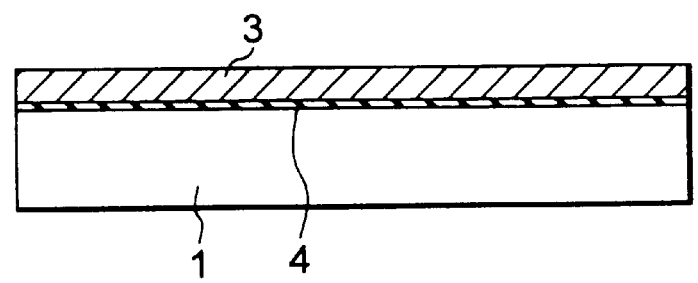
Figure 5D:
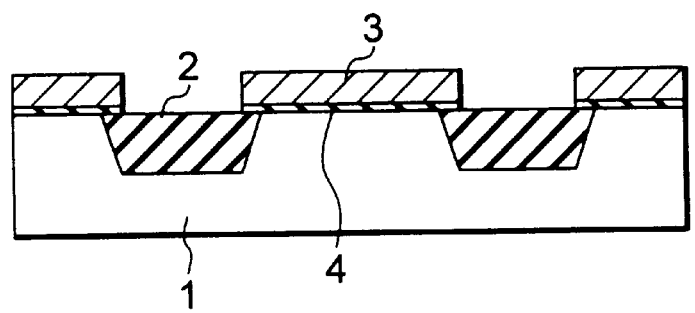
Figure 6A:
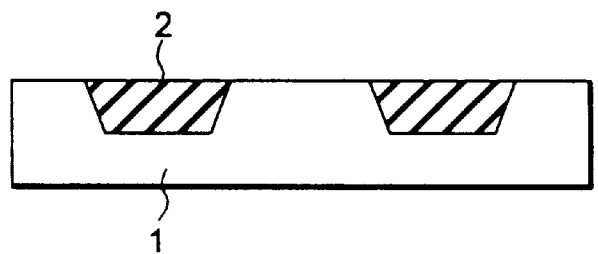
FIGS. 6A to 6D are cross sections illustrating the steps next to the steps illustrated in FIGS. 5A to 5D.
Figure 6B:
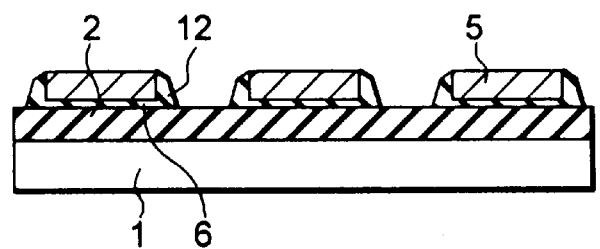
Figure 6C:
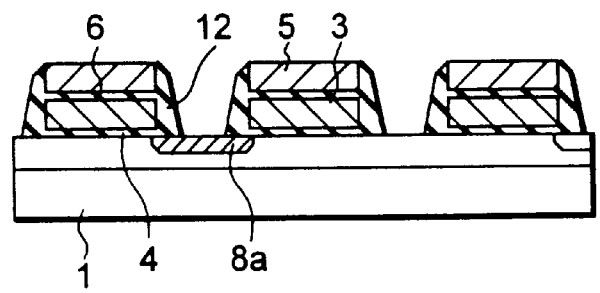
Figure 6D:
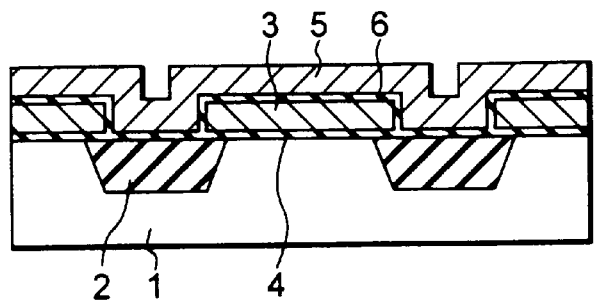
Figure 7A:
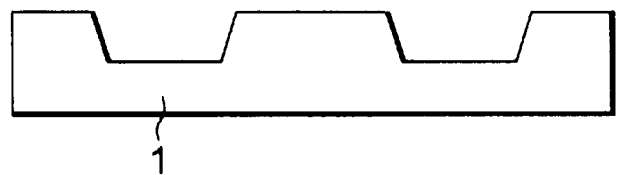
FIGS. 7A to 7D are cross sections illustrating the steps next to the steps illustrated in FIGS. 6A to 6D.
Figure 7B:
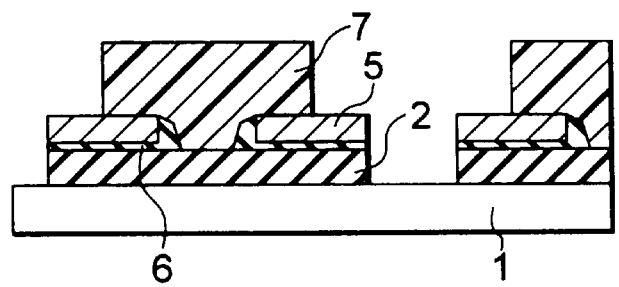
Figure 7C:
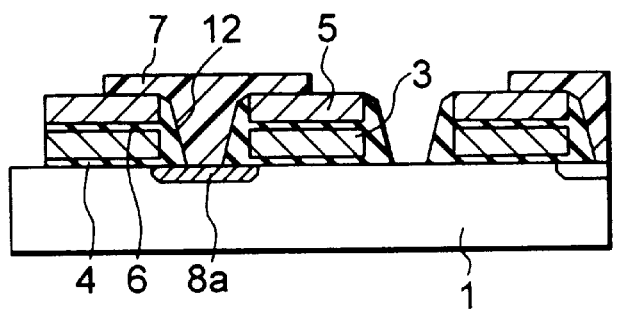
Figure 7D:
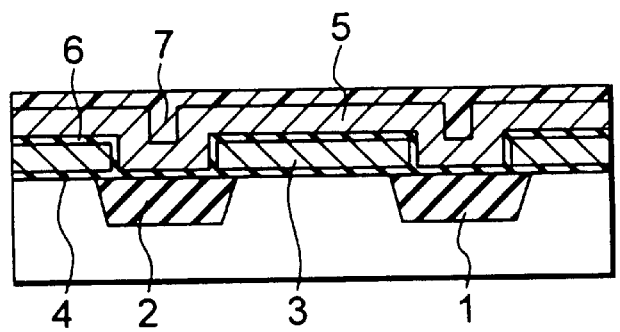
Figure 8A:
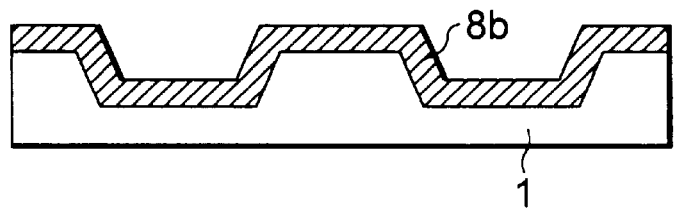
FIGS. 8A to 8D are cross sections illustrating the steps next to the steps illustrated in FIGS. 7A to 7D.
Figure 8B:
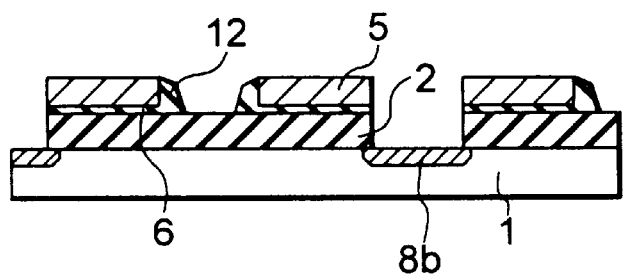
Figure 8C:
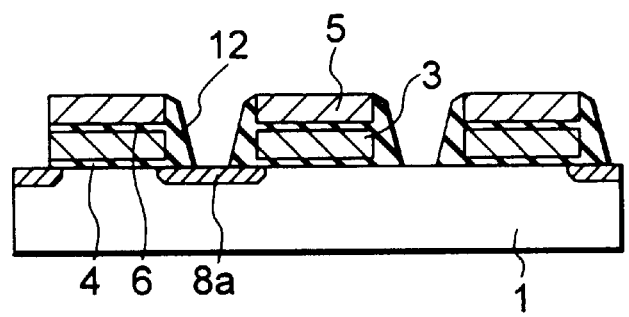
Figure 8D:
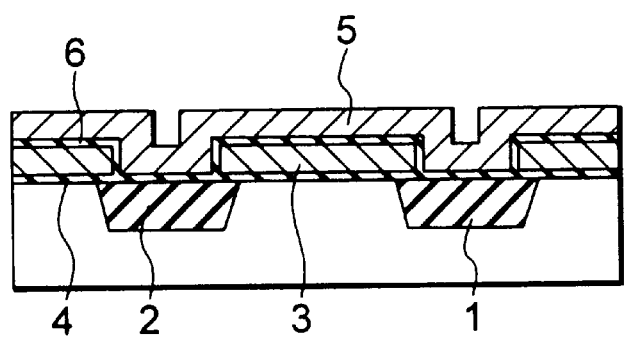
Figure 9A:
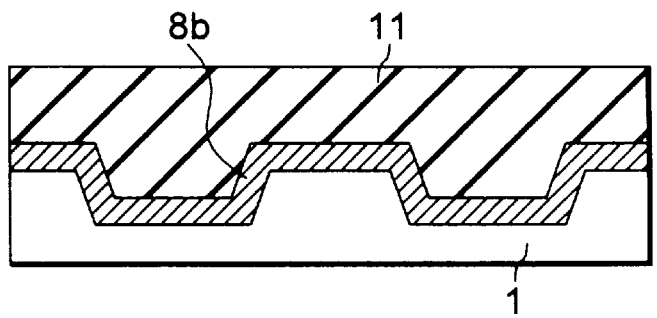
FIGS. 9A to 9D are cross sections illustrating the steps next to the steps illustrated in FIGS. 8A to 8D.
Figure 9B:
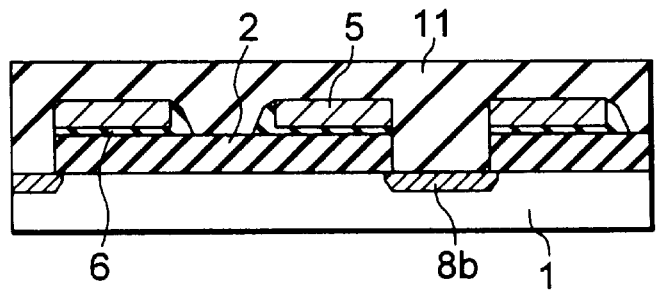
Figure 9C:
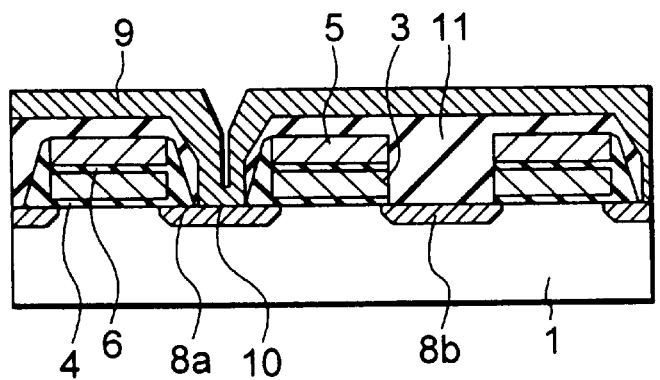
Figure 9D:
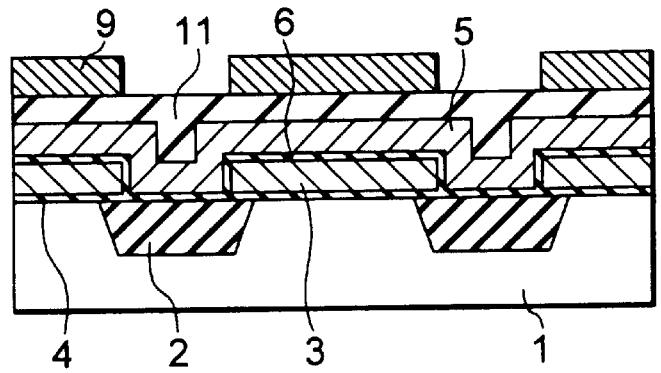

FIG. 1 is a plan view illustrating a non-volatile semiconductor memory device according to an embodiment of the present invention. FIGS. 2A to 2C are cross sections of a non-volatile semiconductor memory device according to a first embodiment of the present invention, and are cross sections taken on I—I line, II—II line, and III—III line of FIG. 1, respectively. In the electrical writable and erasable non-volatile semiconductor memory device 30 according to the present invention, each of source diffusion layers 8b arranged along at least control gate electrodes 5 on a substrate 1 has, in one part thereof, an inclined portion 31 having an angle not smaller than an ion implantation angle.

In this non-volatile semiconductor memory device 30, the source diffusion layer 8b is arranged perpendicularly to a trench device isolation layer 2 and along a trench surface 33 of the trench device isolation layer 2 and a surface 32 of the substrate 1.

In this device 30, the inclined trench surface 33 on the source diffusion layer 8b is arranged along a wall of the trench device isolation layer 2. The source diffusion layers 8b are continuously arranged along the control gate electrode 5.

The following will describe a process for producing the non-volatile semiconductor memory device 30 having the above-mentioned structure.

The characteristic of the process for producing the non-volatile semiconductor memory device 30 according to the present invention is characterized in that even the source diffusion layers 8b having an unevenness form can be made so as to exhibit a stably low resistance by self-aligned source etching of the non-volatile semiconductor memory device 30 using the trench device isolation layers 2.

That is, in order to lower the layer resistance of the source diffusion layer 8b, in an unevenness form, having the trench device isolation layer 2, an oxide film is formed at an angle not smaller than an ion implantation angle on the side wall of the trench device isolation layer 2. The oxide film constitutes the trench device isolation layer 2.

If, at the time of forming the trench device isolation layer 2, this layer 2 is made up so as to have a side wall having an inclination angle not smaller than an ion implantation angle to the source diffusion layer 8b, ions are implanted in the entire surface of the source diffusion layer 8b by subjecting the source diffusion layer 8b to self-aligned source etching, with the control gate electrode 5 being masked, to remove the oxide film of the trench device isolation film 2, and then implanting ions into the source diffusion layer 8b.

FIGS. 3A to 9A are cross sections taken on I—I line of FIG. 1, and illustrate a process for producing the non-volatile semiconductor memory device according to the present embodiment, in order of its steps. FIGS. 3B to 9B are cross sections taken on II—II line of FIG. 1, and illustrate the process for producing the non-volatile semiconductor memory device according to the present embodiment, in order of its steps. FIGS. 3C to 9C are cross sections taken on III—III line of FIG. 1, and illustrate the process for producing the non-volatile semiconductor memory device according to the present embodiment, in order of its steps. FIGS. 3D to 9D are cross sections taken on IV—IV line of FIG. 1, and illustrate a process for producing the non-volatile semiconductor memory device according to the present embodiment, in order of its steps. For example, FIGS. 3A, 3B, 3C and 3D are cross sections of the device in the same step. FIGS. 4A to 4D, as well as FIGS. 5A to 5D and the like, are cross sections of the device in the same step.

The process of the present embodiment makes it possible to lower the resistance of the source diffusion layers 8b and make the cell minute without any increase in steps nor the number of photolithography operations.

According to the present embodiment, in the case that trench device isolations are used in a non-volatile semiconductor memory device, the side walls of the device isolations have an angle not smaller than an ion implantation angle to source diffusion layers, and self-aligned source etching is used to form the source diffusion layers.

That is, in the present embodiment, for the inclined portion 33 which is arranged in at least one portion of each of the source diffusion layer and has an angle not smaller than the ion implantation angle, a trench portion constituting the trench device isolation layer is made up to have an angle not smaller than a predetermined ion implantation angle. This angle is used to implant ions. In this way, the inclined portion 31 can easily be made.

As shown in FIGS. 3A to 3D, trenches 20, each having a depth of about 4000 to 7000 Å for trench device isolation are first formed in given regions of the substrate 1 made of P-type silicone by isotropic dry etching or the like with the use of a resist mask.

At this time, the side wall 31 of each of the trenches 20 is formed so as to have an inclination not smaller than the ion implantation angle, which is used in a subsequent step.

The ion implantation angle is not especially limited, and is set up to, for example, 7°.

Next, an oxide film is deposited on the whole surface of the P-type silicon substrate 1 by chemical vapor deposition (CVD). The oxide film on the P-type silicon substrate 1 is removed by CMP, etch back of the oxide film, or the like, to form a trench device isolation layer 2 made of the oxide film embedded in the trench 20, as shown in FIGS. 4A to 4D. The oxide films of the trench device isolation layers 2 are formed to extend in parallel to each other on the P-type silicon substrate 1.

As shown in FIGS. 5A to 5D, next, a first gate insulating layer 4 made of a thermally oxidized film and having a thickness of about 100 to 200 Å is formed on the entire surface of the substrate 1 and the device isolation layer 2, and subsequently, for example, a polycrystal silicon layer (floating gate electrode 3) of about 1000 to 3000 Å in thickness is formed as a first conductive layer by CVD.

Thereafter, the polycrystal silicon layer which is the first conductive layer is patterned by photolithography, to cause the polycrystal silicon layer to remain only on the P-type silicon substrate 1 which is not covered with the trench device isolation layers 2. In this way, the floating gate electrodes 3 are formed.

As shown in FIGS. 6A to 6D, next, a second gate insulating layer 6 made of a thermally oxidized film or three layers of an oxide film/a nitride film/an oxide film, which has a thickness of about 100 to 300 A, is formed on the floating gate electrodes 3.

Subsequently, a polycrystal silicon layer (control electrode 5) of about 2000 to 4000 Å in thickness is deposited as a second conductive layer on the entire surface of the second gate insulating layer 6 by CVD. A suitable resist mask is then used to etch continuously the polycrystal silicon layer (the control gate electrode 5), the second gate insulating layer 6 and the floating gates 3. Thus, they are patterned.

By this patterning, the polycrystal silicon layer (the control electrode 5) which is the second conductive layer is made up to layers each having a predetermined width and arranged perpendicularly to the device isolation layers 2. In this way, the floating gate electrodes 3 which are formed in at least one part of the surface region of the P-type silicon substrate 1 which is not covered with the trench device isolation layers 2 can be caused to remain so as to have substantially the same width as the control gate electrodes 5.

In this manner, the control gate electrodes 5 are formed from the polycrystal silicon layer.

The control gate electrodes 5 are arranged on the substrate 1, to extend perpendicularly to the trench device isolation layers 2 and in parallel to each other.

Next, using a resist mask and ion implantation, N-type dopant ions, for example, arsenic (As) ions are implanted into first given regions, that is, regions where drain diffusion regions are to be formed in a subsequent step, so as to form drain diffusion regions 8a as N-type dopant diffusion layer regions.

Side wall oxide films 12 are then formed on the side walls of the first gate insulating layer 4, floating gates 3, the second gate insulating layer 6 and the control gate electrodes 5, to obtain an intermediate structure shown in FIGS. 6A to 6D.

As shown in FIGS. 7A to 7D, thereafter, a resist 7 is formed on the entire surface of the semiconductor device, including each drain diffusion region 8a between a pair of the control gate electrodes 5. This resist 7 is patterned to remove the resist 7 on source diffusion layer formation-planning regions 8b, in which source diffusion layers 8b are to be formed. The oxide films of the trench device isolation layers 2 are then subjected to anisotropic etching (self-aligned source etching) with use of the resist 7 and the control gate electrodes 5 as masks, to remove the device isolation layers 2 present in the source diffusion layer formation-planning regions. In this way, the original trench structure is caused to become apparent.

Next, in the state that the resist 7 remains, $N^-$-type dopant ions, for example, phosphorus (P) ions, are implanted into the source diffusion layer formation-planning regions 8b as second given regions. Subsequently, N-type dopant ions, for example, arsenic (As) ions, are implanted therein to form the source diffusion layers 8b shown in FIGS. 8A to 8D.

The ion implantation angle when the ions are implanted is set up to an angle smaller than the angle of the side walls of the trench device isolation layers 2.

As a result, the $N^-$-type and N-type dopant ions are certainly implanted into the side walls of the trench device isolation layers 2, to form the source diffusion layer 8b regions continuously in the direction perpendicular to the trench device isolation layers 2. The mask of the resist 7 is then striped to obtain an intermediate structure shown in FIGS. 8A to 8D.

As shown in FIGS. 9A to 9D, next, an interlayer 11 made of a silicon oxide film containing, for example, boron (B) or phosphorus (P) is deposited on the entire surface of the semiconductor device and then contact holes 10 are made on the drain diffusion layers 8a.

Thereafter, an aluminum wiring layer 9 is deposited on the entire surface of the semiconductor device, and this layer 9 is patterned to obtain a non-volatile semiconductor memory device 30 having a structure shown in FIG. 9.

According to the non-volatile semiconductor memory device 30 obtained by the producing process of the above-mentioned embodiment, the resistance of the source diffusion layers 8b in an uneven form can be made low in a self-aligned source etching manner, without any increase in the number of PR (photolithography) operations, by making the side walls 33 of the trench device isolation layers 2 suitable for making the cell minute so as to have an inclination angle not smaller than the ion implantation angle.

Figure 10A:
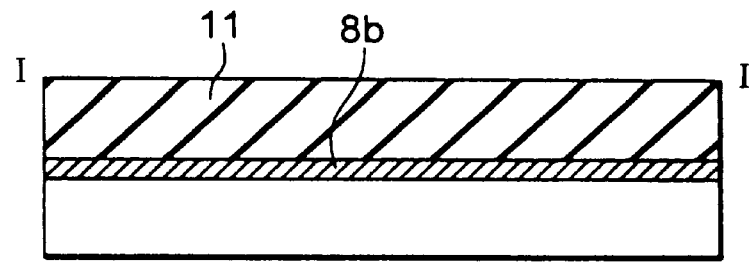
FIGS. 10A to 10C are cross sections of a non-volatile semiconductor memory device according to a second embodiment of the present invention, and are cross sections taken on I—I line, II—II line, and III—III line of FIG. 1, respectively.
Figure 10B:
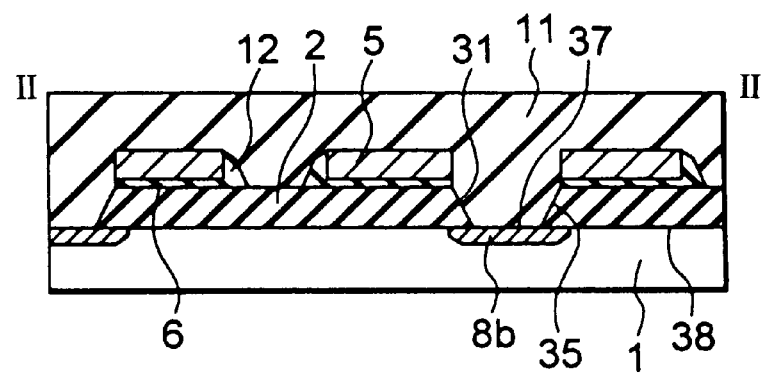
Figure 10C:
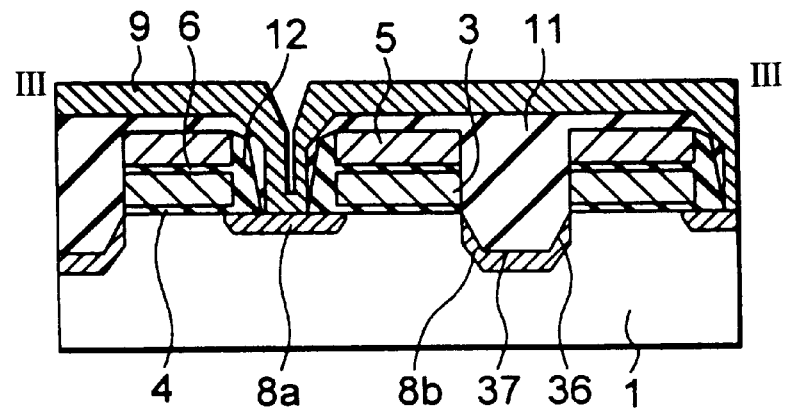
Figure 11A:
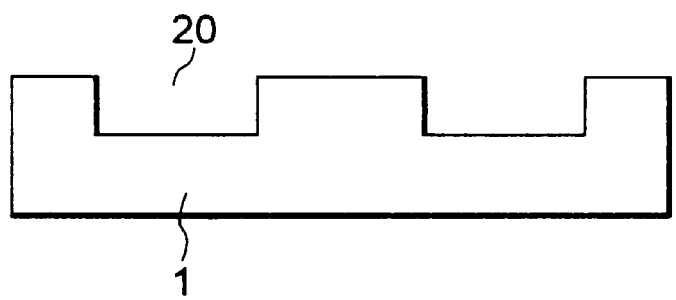
FIGS. 11A to 11D illustrate a process for producing the non-volatile semiconductor memory device according to the second embodiment of the present invention, and are cross sections taken on I—I line, II—II line, III—III line and IV—IV line of FIG. 1, respectively.
Figure 11B:
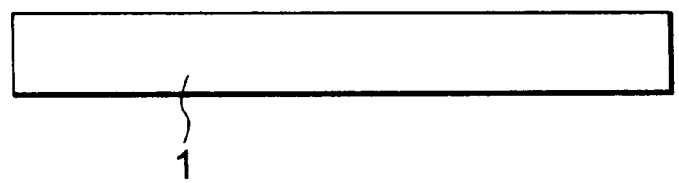
Figure 11C:
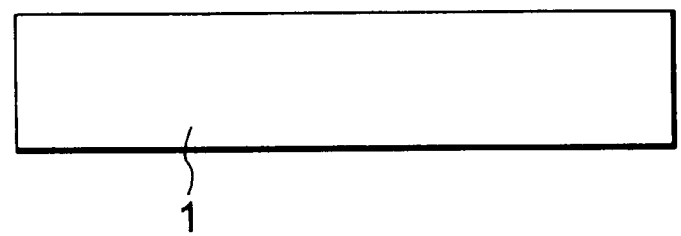
Figure 11D:
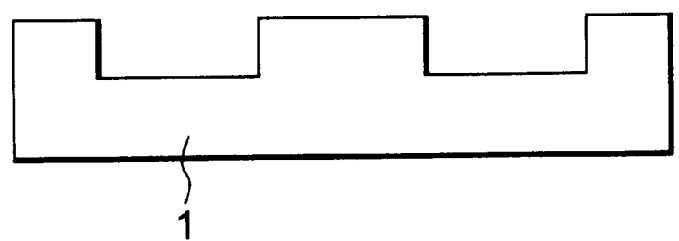
Figure 12A:
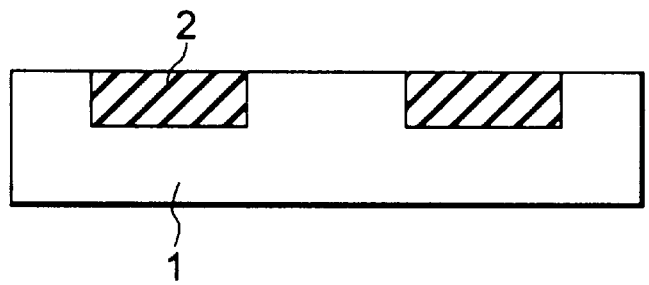
FIGS. 12A to 12D are cross sections illustrating the steps next to the steps illustrated in FIGS. 11A to 11D.
Figure 12B:
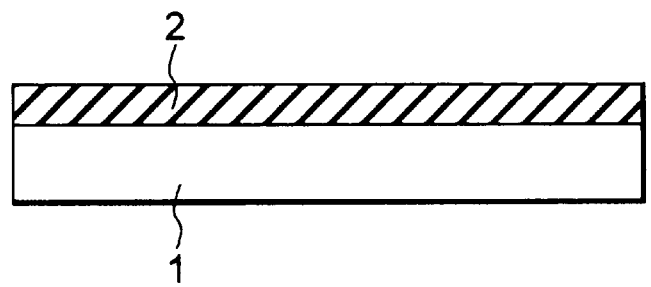
Figure 12C:
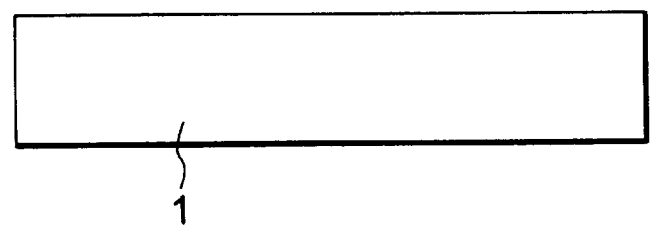
Figure 12D:
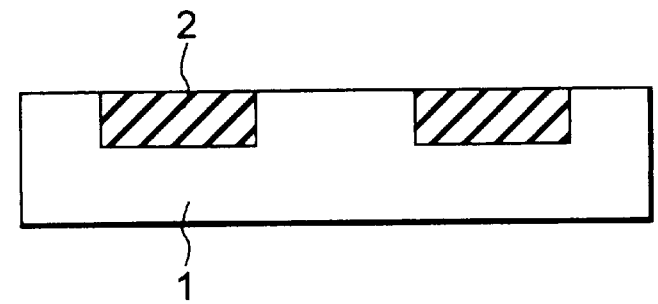
Figure 13A:
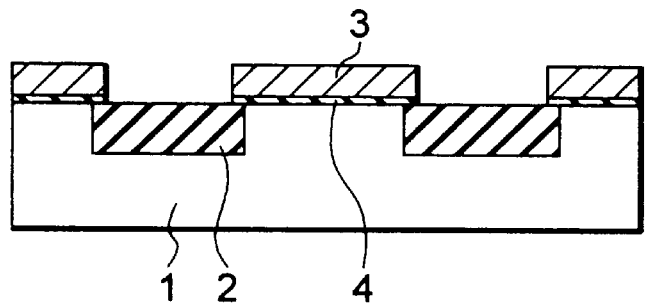
FIGS. 13A to 13D are cross sections illustrating the steps next to the steps illustrated in FIGS. 12A to 12D.
Figure 13B:
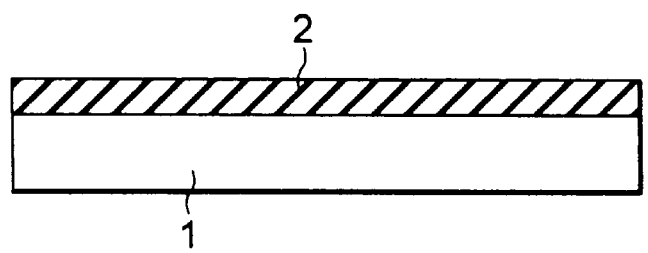
Figure 13C:
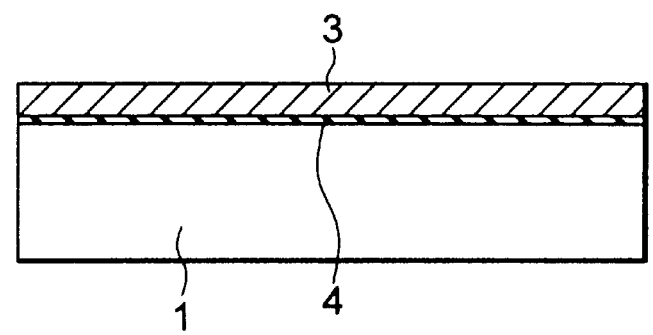
Figure 13D:
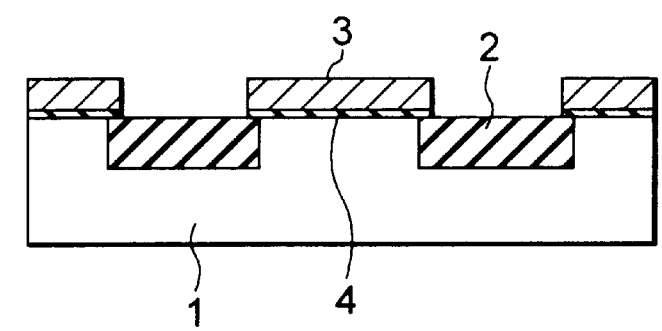
Figure 14A:
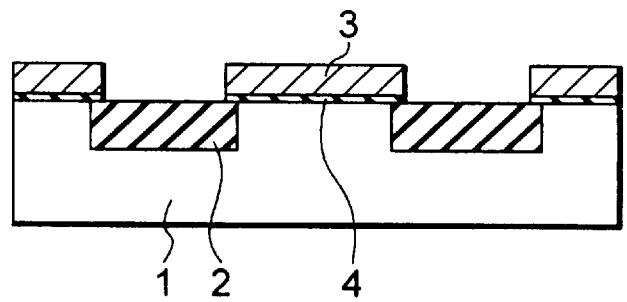
FIGS. 14A to 14D are cross sections illustrating the steps next to the steps illustrated in FIGS. 13A to 13D.
Figure 14B:
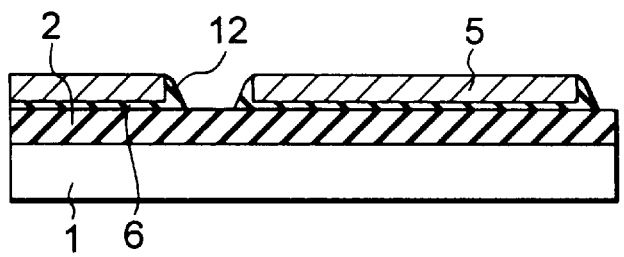
Figure 14C:
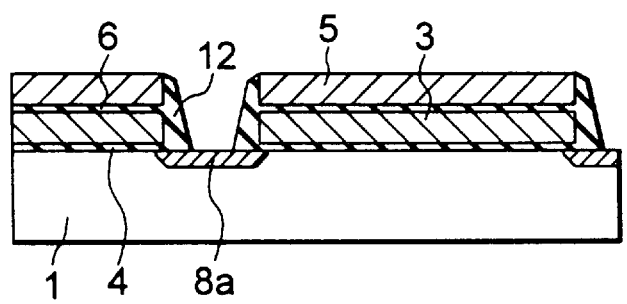
Figure 14D:
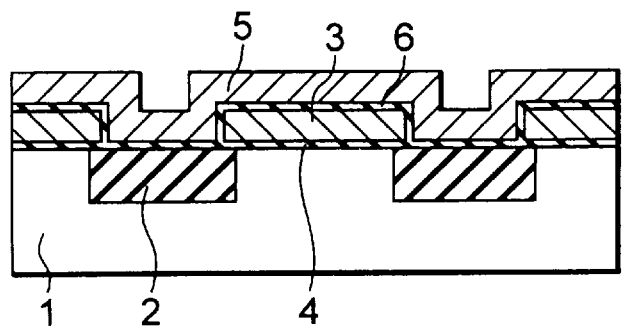
Figure 15A:
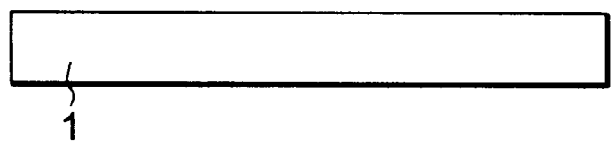
FIGS. 15A to 15D are cross sections illustrating the steps next to the steps illustrated in FIGS. 14A to 14D.
Figure 15B:
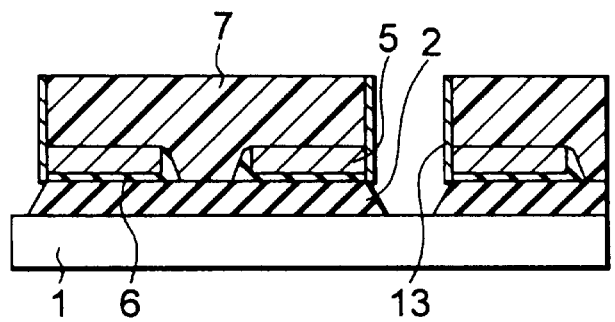
Figure 15C:
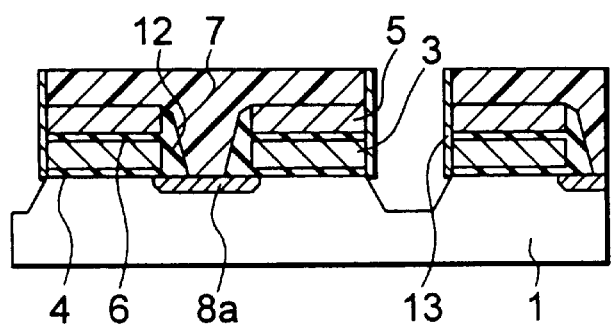
Figure 15D:
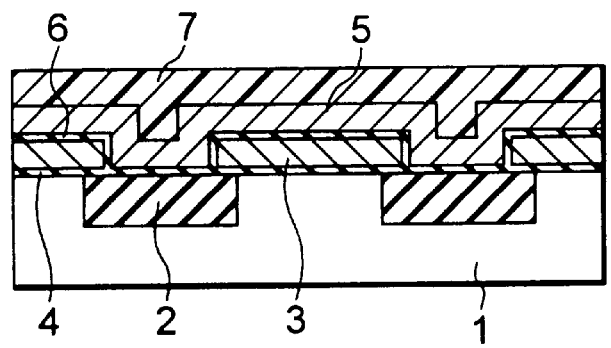
Figure 16A:
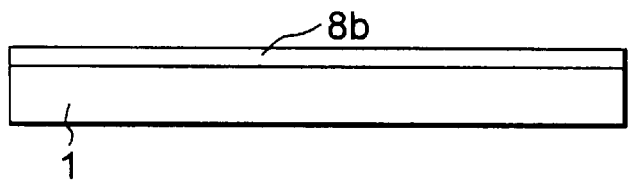
FIGS. 16A to 16D are cross sections illustrating the steps next to the steps illustrated in FIGS. 15A to 15D.
Figure 16B:
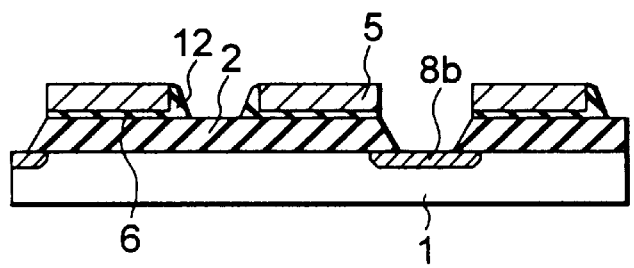
Figure 16C:
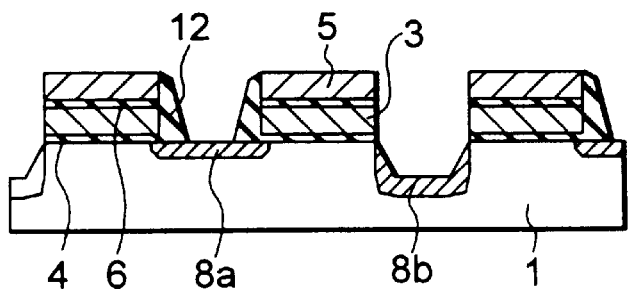
Figure 16D:
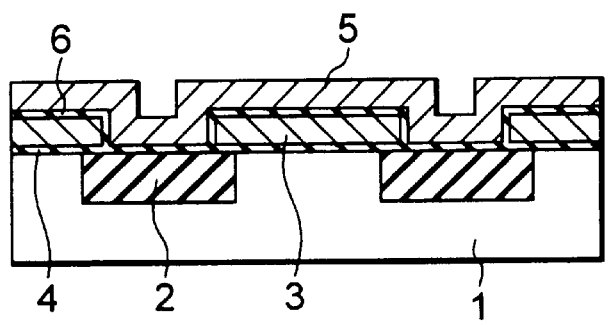
Figure 17A:
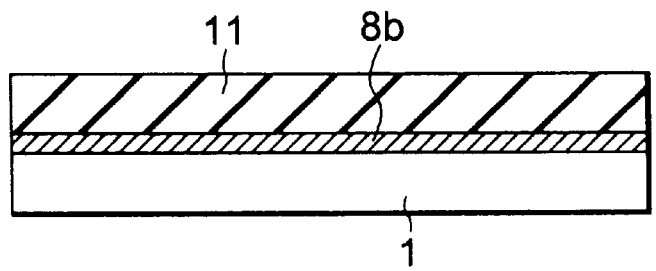
FIGS. 17A to 17D are cross sections illustrating the steps next to the steps illustrated in FIGS. 16A to 16D.
Figure 17B:
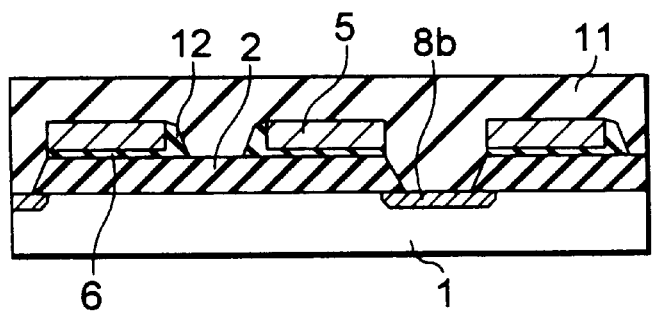
Figure 17C:
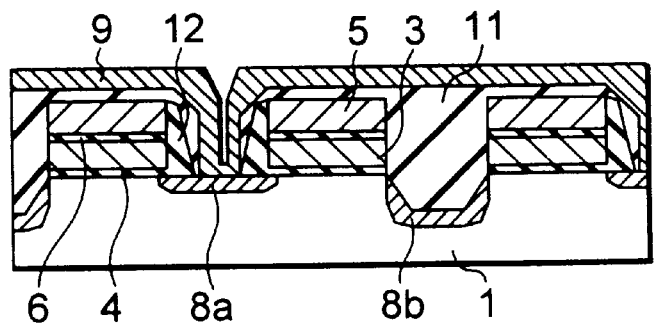
Figure 17D:
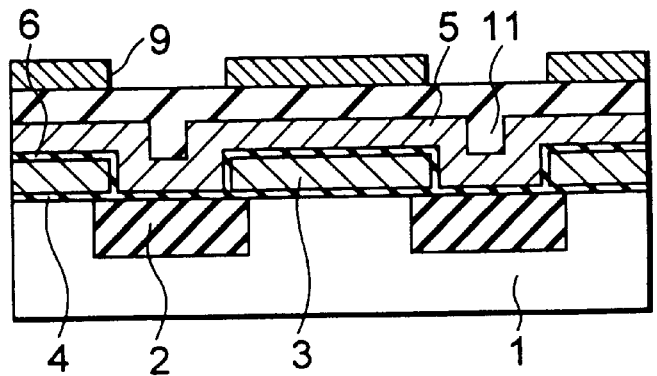
Figure 18A:
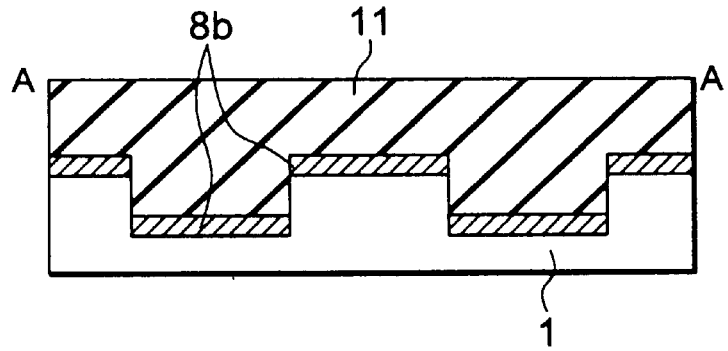
FIGS. 18A to 18C are cross sections of a conventional non-volatile semiconductor memory device.
Figure 18B:
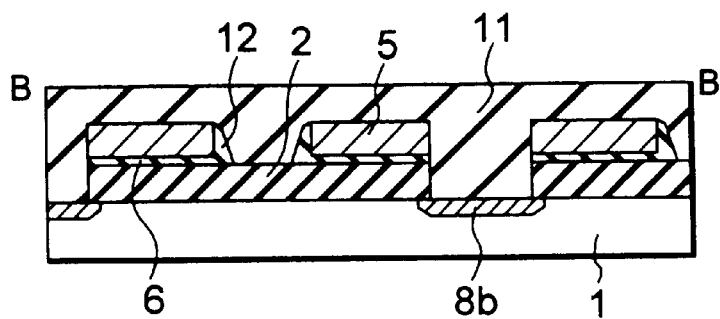
Figure 18C:
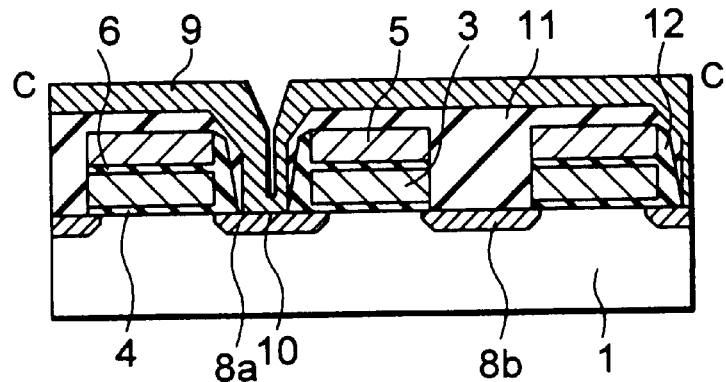

The following will describe a non-volatile semiconductor memory device 30 according to a second embodiment of the present invention, and a process for producing the same, referring to FIGS. 10A to 10C, FIGS. 11A to 11D, FIGS. 12A to 12D, FIGS. 13A to 13D, FIGS. 14A to 14D, FIGS. 15A to 15D, FIGS. 16A to 16D and FIGS. 17A to 17D. The plan view of the non-volatile semiconductor memory device 30 of the present embodiment is substantially the same as shown in FIG. 1. FIGS. 10A to 10C are cross section taken on I—I line, II—II line and III—III line of FIG. 1, respectively. The other drawings are also the same. For example, FIGS. 11A to 11D are cross sections taken on I—I line, II—II line, III—III line and IV—IV line, of FIG. 1 respectively.

In the above-mentioned first embodiment, in order to form stable source diffusion layer having a low resistance in the non-volatile semiconductor memory device 30 using the trench device isolation layers 2, the uneven portions of the source diffusion layers 8b, that is, the side walls of the trenches of the trench device isolation layers are formed to have inclined faces having an angle not smaller than the ion implantation angle. According to the second embodiment, however, in the non-volatile semiconductor memory device using the trench device isolation layers 2, the source diffusion layers 8b which are stable and have a low resistance can be obtained by removing the level difference of the source diffusion layers 8b themselves.

That is, as shown in FIGS. 10A to 10C, in the electrical writable and erasable non-volatile semiconductor memory device 30 according to he second embodiment, each of the source diffusion layers 8b arranged on the substrate 1 and along at least the control gate electrodes 5 has, in at least one part thereof, inclined portions 35 and 36 each having an angle not smaller than an ion implantation angle. The source diffusion layers 8b have flat faces 37 which are perpendicular to the device isolation film 2 and have substantially the same level as a lower face 38 of the device isolation layers 2.

The source diffusion layers 8b are continuously arranged along the control gate electrodes 5. The inclined portions 35 and 36 in the source diffusion layer 8b are formed at least between the electrode portion 5 or 3 connected to the control gate electrode 5 and the flat portion 37 of the source diffusion layer 8b.

The inclined portions 35 and 36 in the source diffusion layer 8b are formed along the side of the substrate 1 arranged between the electrode portion connected to the control gate electrode 5 and the flat face 37 of the source diffusion layer 8b, or along the side wall composed of the device isolation layer 2 constituting the side wall of the source diffusion layer 8b.

As understood from FIGS. 10A to 10C, the level difference based on unevenness of the I—I section of the source diffusion layer can be removed and further the source diffusion layer can be formed to have, along the III—III section, an inclination angel not smaller than the ion implantation angle by using, when the oxide film SiO$_2$ of the trench device isolation film 2 and the Si of the P-type silicon substrate 1 are dry etched in the etching for forming the source diffusion layers 8b, gas having the same etching rate for the two and performing isotropic dry etching. In this way, the offset of the transistors can be removed and the source diffusion layers can be made stable.

The following will describe the structure of the non-volatile semiconductor memory device 30 according to the second embodiment of the present invention and a process for producing the same, referring to FIGS. 11A to 11D to FIGS. 17A to 17D.

As shown in FIGS. 11A to 11D, trenches 20 having a depth of about 4000 to 7000 Å are first made in the surface region of the P-type silicon substrate 1 by anisotropic dry etching. The trenches 20 are for forming the device isolation layers 2.

As shown in FIGS. 12A to 12D, thereafter, an oxide film is deposited on the entire surface of the substrate 1 by chemical vapor deposition (CVD), and the oxide film on the substrate 1 is removed by CMP, etch-back of the oxide film, or the like, to expose the surface thereof. Thus, the trench device isolation layers 2 made of the oxide film are made in the trenches 20. Ordinary device isolation layers may be used instead of the trench device isolation layers 2. The trench device isolation layers 2 are formed on the substrate 1 to extend in parallel to each other.

As shown in FIGS. 13A to 13D, next, a first gate insulating layer 4 having a thickness of about 100 to 200 Å and made of a thermally oxidized film is formed, and then a polycrystal silicon layer (floating gate electrode 3)having a thickness of about 1000 to 3000 Å is formed as a first conductive layer by CVD.

The polycrystal silicon layer which is the first conductive layer is patterned to cause this layer to remain on the surface of the P-type silicon substrate 1 on which the trench device isolation layers 2 are not present. In this way, the floating gate electrodes 3 are formed.

As shown in FIGS. 14A to 14D, next, a thermally oxidized film or a three-layer structure of an oxide film/a nitride film/an oxide film, having a thickness of about 100 to 300 Å, is formed as a second gate insulating film 6 on the floating gate electrodes 3.

Next, a polycrystal silicon layer (control gate electrode 5) having a thickness of about 2000 to 4000 Å is deposited as a second conductive layer on the entire surface by CVD, and then the polycrystal silicon layer which will become control gate electrodes 5, the second gate insulating layer 6 and floating gate electrodes 3 are patterned and removed in a partial region at the side of the drain diffusion layers 8a.

That is, the stacked layers composed of the polycrystal silicon layer which will become control gate electrodes 5, the second gate insulating layer 6 and floating gate electrodes 3 are etched and removed by a predetermined width, in the direction perpendicular to the direction along which the trench device isolation layers 2 are formed. This step is a step for removing the stacked layers formed in the regions where the drain diffusion layers 8a are to be formed in a subsequent step.

In the present embodiment, a polycide layer may be used instead of the polycrystal silicon layer. This makes it possible to etch only the drain diffusion layers 8a side of the control gate electrodes 5, the second gate oxide film 6 and the floating gates 3.

Subsequently, a resist mask and ion implantation are used to implant N-type dopant ions, for example, arsenic (As) ions, into first given regions to form the drain diffusion layers 8a constituting N-type dopant diffusion layer regions.

Next, side wall oxide films 12 are formed on the side walls of the control gate electrodes 5, the second gate oxide film 6, the floating gate electrodes 3 and the first gate oxide film 4. In this way, the structure shown in FIGS. 14A to 14D is obtained.

As shown in FIGS. 15A to 15D, next, a resist 7 is used to pattern the control gate electrodes 5, the second gate insulating layer 6 and the floating gate electrodes 3 at the source diffusion layer 8b side. As etching for the patterning, anisotropic dry etching is used to form the control gate electrodes 5. The control gate electrodes 5 are arranged on the substrate to extend perpendicularly to the field oxide films 2 and in parallel to each other.

Thereafter, in order to use the same resist 7 and form the source diffusion layers 8b, as a gas for etching the P-type silicon substrate 1 and the oxide film of the trench device isolation layers 2, there is used a gas having the same etching rate for the two. Thus, isotropic dry etching (self-aligned source etching) is performed until the oxide film of the trench device isolation layers 2 is lost.

At this time, the level difference of the I—I section of the source diffusion layers 8b is removed by using the gas having the same etching rate. The source diffusion layers 8b of the III—III section are formed to have the inclined portions 35 and 36 having an angle not smaller than the ion implantation angle by performing isotropic dry etching. In this way, the offset of the transistors can be removed.

At this time, the control gate electrodes 5, the second gate oxide film 6, the floating gates 3 and the first gate oxide film 4 are not etched since they are protected by a reaction product 13 generated by the anisotropic dry etching. Thus, the structure shown in FIG. 15 is obtained.

As shown in FIGS. 16A to 16D, next, in the state that the resist 7 remains, N$^-$-type dopant ions, for example, phosphorus (P) ions are implanted into the source forming regions 8b constituting the second given regions and subsequently N-type dopant ions, for example, arsenic (As) ions are implanted thereinto to form the source diffusion layers 8b constituting N-type dopant diffusion layer regions. Thereafter, the resist 7 is striped to obtain the structure shown in FIG. 16.

As shown in FIGS. 17A to 17D, next, an interlayer 11 made of a silicon oxide film containing, for example, boron (B) or phosphorus (P) is deposited, and then contact holes 10 are made on the drain diffusion layers 8a. Thereafter, an aluminum wiring layer 9 is deposited on the entire surface of the non-volatile semiconductor memory device 30. This layer 9 is patterned to obtain the structure shown in FIG. 17.

The semiconductor memory device obtained by the above-mentioned producing process has the trench device isolations suitable for making the device element minute. When the control gate electrodes 5 are obtained by patterning, the source diffusion layers are simultaneously formed. The dry etching at that time is such isotropic etching that the etching rates for silicon and the oxide film are the same. For these reasons, the source diffusion layers can be formed without having any level difference in the I—I sectional direction. Moreover, the source diffusion layers can be made stable and low in resistance without any increase in the number of photolithography operations by making the source diffusion layers up to have, along the III—III section, an inclination angle not smaller than the ion implantation in the manner that any offset is removed.

In the explanation on the present embodiment, the oxide film of the ordinary trench device isolation layers 2 has been described. However, the present invention can be applied to any device isolation in semiconductor substrates.

According to the non-volatile semiconductor memory device 30 of the present embodiment, the device elements can be made minute without any increase in the numbers of the steps and PR operations, and the resistance of the source diffusion layer can be made low.

What is claimed is:

1. A process for producing an electrically writable and erasable non-volatile semiconductor memory device, comprising:

forming a trench whose side wall is formed to have an angle not smaller than an ion implantation angle, on a surface of a substrate, along a predetermined direction and in parallel to each other, depositing an oxide film in the trench to form a trench device isolation layer, depositing and forming a first gate insulating layer and a first conductive layer in sequence on the surface of the substrate and then patterning them, to form floating gate electrodes on at least one part of the surface of the substrate which is not covered with the trench device isolation layer, depositing and forming a second gate insulating layer and a second conductive layer in sequence on the surfaces of the floating gate electrodes and the trench device isolation layer and then patterning them, to form, along a direction perpendicular to the trench device isolation layer, control gate electrodes with which the surfaces of the trench device isolation layer and the floating gate electrodes are alternately covered, implanting and diffusing a dopant into the surface of the substrate exposed along at least one side wall of each of the control gate electrodes, to form a drain region, forming a side wall oxide film on the side wall of an electrode portion wherein the control gate electrodes and the floating gate electrodes are stacked, and removing the floating gate electrodes other than the floating gate electrodes covered with the control gate electrodes, covering the drain region formed along one side wall of each of the control gate electrodes with a resist and performing etching with the use of the resist and the control gate electrodes as masks, to remove the trench device isolation layer arranged on the surface of the substrate exposed along the other side wall of each of the control gate electrodes, implanting and diffusing a dopant into the surface of the substrate exposed along the other side wall of each of the control gate electrodes in an uneven form, after removal of the trench device isolation layer, in the state that the resist remains, at an ion implantation angle smaller than the inclination angle of the side wall of the trench device isolation layer, to form a source diffusion layer, and forming an interlayer insulation layer on the entire surface of the substrate, forming contact holes in at least one part of the drain diffusion layer, and then connecting a wiring layer having a given pattern to the contact hole.

2. The process for producing a non-volatile semiconductor memory device according to claim 1, wherein the etching for removing the trench device isolation layer arranged on the surface of the substrate comprises anisotropic etching.

3. A process for producing an electrically writable and erasable non-volatile semiconductor memory device, comprising:

forming a device isolation layer made of an oxide layer on a surface of a substrate, along a predetermined direction and in parallel to each other, depositing and forming a first gate insulating layer and a first conductive layer in sequence on the surface of the substrate and then patterning them, to form a floating gate electrode on at least one part of the surface of the substrate which is not covered with the trench device isolation layer, depositing and forming a second gate insulating layer and a second conductive layer in sequence on the surface of the floating gate electrode and the trench device isolation layer and then patterning them, to form, along a direction perpendicular to the trench device isolation layer, a region to be formed a drain diffusion region on the surface of the substrate, implanting and diffusing a dopant into the region to be formed a drain diffusion region, to form drain diffusion region, and forming an oxide film on at least a side wall of the floating gate electrode and the second conductive layer, covering the surfaces of the drain diffusion layer and the second conductive layer near the region with a resist, and etching the resist on a region to be formed a source diffusion layer on the surface of the second conductive layer, to remove simultaneously the second conductive layer, the second gate insulating layer, a floating gate and the first gate insulating layer on the region to be formed a source diffusion layer, thereby forming control gates made of the second gate insulating layer perpendicularly to the device isolation layers, etching the region to be formed with a source diffusion layer such that the device isolation layers disappear, to remove the device isolation layers and the substrate simultaneously and form a trench having a flat base, thereby forming control gates made of the second conductive layer, and further making side walls of the region to be formed with a source diffusion layer so as to have an inclined portion having an angle not smaller than an ion implantation angle, implanting and diffusing a dopant into the region to be formed with a source diffusion layer to form source diffusion layers, and striping the resist, forming an interlayer insulation layer on the entire surface of the substrate, forming a contact hole in at least one part of the drain diffusion region, and then connecting wiring layer having a given pattern to the contact hole.

4. The process for producing a non-volatile semiconductor memory device according to claim 3, wherein the etching of a group of the electrodes including the second conductive layer and the floating gate to form the region to be formed with a source diffusion layer comprises anisotropic etching.

5. The process for producing a non-volatile semiconductor memory device according to claim 3, wherein, in the etching of the substrate and the device isolation layers in the forming of the region to be formed with a source diffusion layer, an etching agent is used having the same etching rates for the substrate and the device isolation layers.

6. The process for producing a non-volatile semiconductor memory device according to claim 3, wherein the etching of the substrate and the device isolation layer in the forming of the source diffusion layer formation-planning regions comprises isotropic dry etching.

* * * * *